United States Patent
Dulger

(10) Patent No.: US 9,423,444 B2
(45) Date of Patent: Aug. 23, 2016

(54) IDENTIFYING DEFECTIVE ELECTRICAL CABLES

(71) Applicant: BIOSENSE WEBSTER (ISRAEL), LTD., Yokneam (IL)

(72) Inventor: Oleg Dulger, Zichron Yaacov (IL)

(73) Assignee: BIOSENSE WEBSTER (ISRAEL), LTD., Yokneam (IL)

( * ) Notice: Subject to any disclaimer, the term of this patent is extended or adjusted under 35 U.S.C. 154(b) by 336 days.

(21) Appl. No.: 13/952,759

(22) Filed: Jul. 29, 2013

(65) Prior Publication Data
US 2015/0028884 A1 Jan. 29, 2015

(51) Int. Cl.
*G01R 31/02* (2006.01)

(52) U.S. Cl.
CPC ............ *G01R 31/021* (2013.01); *G01R 31/025* (2013.01); *G01R 31/026* (2013.01)

(58) Field of Classification Search
CPC .... G01R 31/021; G01R 31/023; G01R 19/00; G01R 19/2513; G01R 31/11; G01R 31/025; G01R 31/026; G01R 31/04; G01R 1/0416; G01R 29/085; G01R 31/041; H04L 12/2697
See application file for complete search history.

(56) References Cited

U.S. PATENT DOCUMENTS

| | | | |
|---|---|---|---|
| 3,944,914 A | | 3/1976 | Simmonds |
| 4,480,251 A | * | 10/1984 | McNaughton .......... H04M 3/28 324/525 |
| 4,578,636 A | | 3/1986 | Bakke et al. |
| 5,155,440 A | * | 10/1992 | Huang ................. G01R 31/021 324/539 |
| 5,231,357 A | * | 7/1993 | Moody ................ G01R 31/026 29/593 |
| 5,420,512 A | | 5/1995 | Spillane et al. |
| 5,552,712 A | * | 9/1996 | Weir ...................... G01R 31/27 324/537 |
| 6,895,346 B2 | | 5/2005 | Hamamura et al. |
| 7,859,284 B2 | | 12/2010 | Ikeda |
| 2003/0141875 A1 | | 7/2003 | Seymond |

FOREIGN PATENT DOCUMENTS

EP 0403547 9/1989
JP 11125650 A 5/1999

OTHER PUBLICATIONS

Examination Report for European Patent Application No. 14178818.2; mailed on Dec. 8, 2014.

* cited by examiner

*Primary Examiner* — Arleen M Vazquez
*Assistant Examiner* — Alesa Allgood

(57) ABSTRACT

A method includes coupling an electrical cable, including multiple wires, to circuitry including a resistor bank connected to the wires. A gain of the circuitry is measured including the cable. Based on the measured gain, one or more of the wires in the cable that are defective are identified. An indication of the defective wires is output.

11 Claims, 2 Drawing Sheets

IDENTIFYING DEFECTIVE ELECTRICAL CABLES

FIELD OF THE INVENTION

The present invention relates generally to electrical cables, and particularly to methods for identifying defective electrical cables.

BACKGROUND OF THE INVENTION

Various methods and systems for testing electrical cables are known in the art. For example, European Patent EP0403547, whose disclosure is incorporated herein by reference, describes an automatic tester for a multi-wire cable having a remote unit to connect one end of a cable to directly loop together wires to form paired forward and return wires and a local unit connected to the other end of the cable.

U.S. Pat. No. 5,155,440, whose disclosure is incorporated herein by reference, describes a hand-held apparatus for testing cable harness for faults and performance impairments comprises three sets of voltage references, CMOS comparator circuitry, programmable DIP switches, an LED status display for error detection, an LED for indication of overall system condition, and a power source.

SUMMARY OF THE INVENTION

An embodiment of the present invention described herein provides a method including coupling an electrical cable, including multiple wires, to circuitry including a resistor bank connected to the wires. A gain of the circuitry is measured including the cable. Based on the measured gain, one or more of the wires in the cable that are defective are identified. An indication of the defective wires is output.

In some embodiments, coupling the electrical cable includes coupling first ends of the wires to respective first resistors, and second ends of the wires to respective second resistors. In other embodiments, the first resistors have resistances that are odd multiples of a resistance R, and the second resistors have the resistances that are even multiples of R. In yet other embodiments, identifying the one or more defective wires includes identifying an open circuit in one or more of the wires upon detecting that the measured gain is smaller than an expected gain for a non-defective cable.

In some embodiments, identifying the one or more defective wires includes identifying a short circuit between two or more of the wires upon detecting that the measured gain is larger than an expected gain for a non-defective cable. In other embodiments, identifying the one or more defective wires includes storing a predefined list of gains for respective expected defects in the cable, and determining the one or more defective wires by finding on the list an expected defect that matches the measured gain. In yet other embodiments, measuring the gain includes measuring the gain of an inverting operational amplifier with a feedback resistance and an equivalent input resistance, the equivalent input resistance including the multiple wires in the cable.

There is additionally provided herein, in accordance with an embodiment of the present invention, an apparatus including circuitry and an interface for coupling to an electrical cable including multiple wires. The circuitry includes a resistor bank connected to the wires and is configured to measure a gain of the circuitry including the cable, and, based on the measured gain, to identify one or more of the wires in the cable that are defective, and to output an indication of the defective wires.

The present invention will be more fully understood from the following detailed description of the embodiments thereof, taken together with the drawings in which:

DETAILED DESCRIPTION OF EMBODIMENTS

Overview

Embodiments of the present invention described herein provide improved methods and systems for identifying defective electrical cables. In the disclosed embodiments, a cable with multiple wires is coupled to a cable test set, which measures the gain of a test circuit including the cable. The test circuit comprises a resistor bank, i.e., multiple resistors that are coupled to the respective wires of the cable under test. If one or more wires in the cable are defective, the measured gain of the test circuit will differ from the expected gain for a non-defective cable.

Moreover, with a properly designed test circuit, the measured gain is unambiguously indicative of the actual defect. The measured gain may indicate, for example, which of the wires are broken or which pair of wires are shorted. Thus, the test set is able to detect both open-circuit and short-circuit defects in a multi-wire cable, using only a single gain measurement.

System Description

Figure 1:
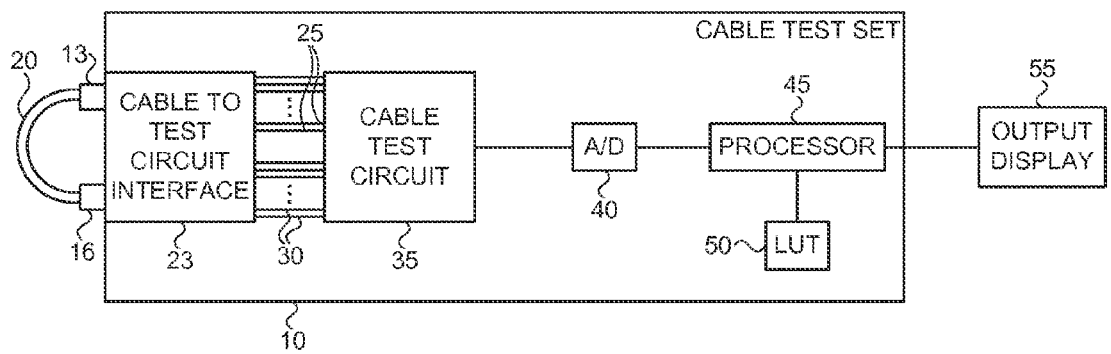
FIG. 1 is a block diagram that schematically illustrates a cable test set, in accordance with an embodiment of the present invention.

FIG. 1 is a block diagram that schematically illustrates a cable test set (CTS) 10, in accordance with an embodiment of the present invention. A cable under test 20 comprising N wires, where N is an integer, is coupled to CTS 10 through a cable-to-test-circuit interface 23. In some embodiments, cable 20 comprises N wires that are coupled to CTS 10 through a first connector 13 at a first end of cable 20, and through a second connector 16 at a second end of cable 20. The first and second connectors couple the multiple wires to interface 23.

Interface 23 is configured to route the N wires in cable 20 from first connector 13 to a first set 25 of interconnects in CTS 10, and from second connector 16 to a second set 30 of interconnects in CTS 10. The first and second sets of interconnects can be formed on any suitable substrate using any suitable conductor, or may be internal wires in CTS 10. The first and second sets of interconnects are coupled into a cable test circuit 35. The output of CTS 10 is subsequently coupled to an analog-to-digital converter (A/D) 40 and a processor 45.

Processor 45 is configured to identify which of the N wires in cable 20 are defective from gain measurements made by cable test circuit 35. The value of the gain measurement is subsequently digitized in A/D 40 and relayed to processor 45. In some embodiments, processor 45 uses data stored in a lookup table (LUT) 50 which correlates predefined defective wire configurations to the measured gain so as to identify the one or more defective wires in cable 20. CTS 10 then outputs an indication to a user identifying which wires among the N wires in cable 20 are defective. The output may be provided, for example, to an output display 55.

The system configuration as shown in FIG. 1 is an exemplary configuration, which is depicted purely for the sake of conceptual clarity. Alternatively, any other suitable system configuration can be used to perform the functions described herein. Some elements of cable test set 30 may be implemented in hardware, e.g., in one or more Application-Specific Integrated Circuits (ASICs) or Field-Programmable Gate Arrays (FPGAs). Additionally or alternatively, some elements of cable test set 10 can be implemented using software, or using a combination of hardware and software elements. In some embodiments, processor 45 comprises a general-purpose computer, which is programmed in software to carry out the functions described herein. The software may be downloaded to the computer in electronic form, over a network, for example, or it may, alternatively or additionally, be provided and/or stored on non-transitory tangible media, such as magnetic, optical, or electronic memory.

Identifying Defective Wires in a Cable

Figure 2:
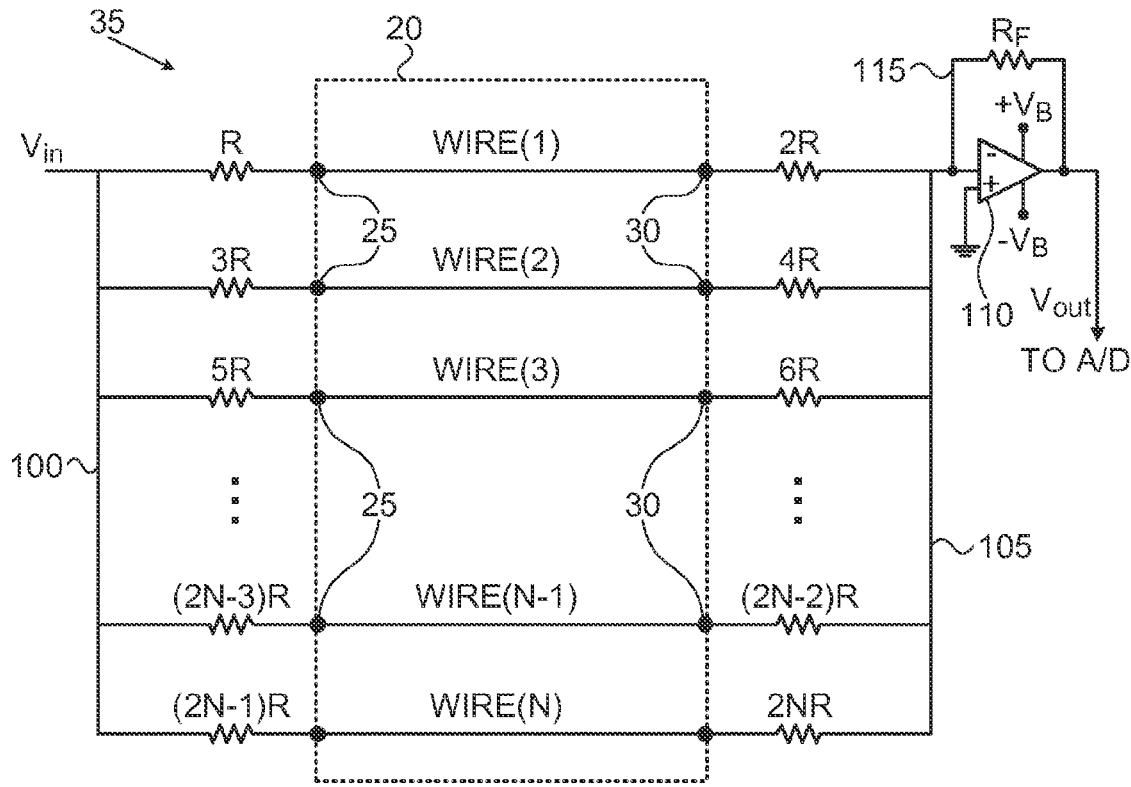
FIG. 2 is a diagram that schematically illustrates a cable test circuit, in accordance with an embodiment of the present invention.

FIG. 2 is a diagram that schematically illustrates cable test circuit 35, in accordance with an embodiment of the present invention. Cable test circuit 35 comprises an amplifier 110 and a resistor bank, which comprises a first bank of N resistors 100 and a second bank of N resistors 105. In the embodiment of FIG. 2, the N wires in cable 20 connect the N resistors in first bank 100 to the respective N resistors in second bank 105.

In some embodiments, first resistor bank 100 comprises resistors with respective values of odd multiples of some baseline resistance R (e.g., R, 3R, 5R, ..., [2N−3]R, and [2N−1]R). Similarly, second resistor bank 105 comprises resistors with respective values of even multiples of resistance R (e.g., 2R, 4R, 6R, ..., [2N−2]R, and 2NR) as shown in FIG. 2. The N wires in cable 20 are denoted herein as WIRE(1), WIRE(2), WIRE(3), ..., WIRE(N−1), and WIRE(N) with wire indices 1, 2, 3, ... N−1, N, respectively. In other embodiments, any other suitable resistor values can be used in the first and second resistor banks.

Connector 13 routes the N multiple wires at the first end of cable 20 to first set 25 of N interconnects exiting interface 23 that couple the N wires to N resistors shown in first resistor bank 100. Similarly, connector 16 routes the N wires at the second end of cable 20 to second set 30 of N interconnects exiting interface 23 that couple the N wires to respective N resistors shown in second resistor bank 105. In this manner, cable 20 with connector 13 and connector 15 is electrically coupled to circuit 35 shown in FIG. 2, and included in the gain measurement of circuit 35.

In the exemplary configuration shown in FIG. 2, cable test circuit 35 comprises an inverting operational amplifier. Amplifier 110 is biased with voltages $+V_B$ and $-V_B$. The magnitude of the gain G of the inverting operational amplifier circuit is given by:

$$R_F = -G \cdot R_{EQ} \quad (1)$$

where a feedback resistor 115 has resistance value $R_F$. The equivalent input resistance $R_{EQ}$ of the resistor bank of the inverting amplifier including the N wires, for a non-defective cable, is given by:

$$R_{EQ} = \frac{1}{\sum_{i=1}^{N} \frac{1}{(2i-1)R + 2iR}} \quad (2)$$

An input voltage $V_{IN}$ is applied to circuit 35 including cable 20. The output voltage $V_{OUT}$ from amplifier 110 is measured and is typically used to calculate the measured gain G, (i.e., $G = V_{OUT}/V_{IN}$), which is equivalent to the gain in Equations (1) and (2) defined by the resistor values shown in the first 100 and second 105 resistor banks shown in FIG. 2 if the cable is non-defective.

In the embodiments presented herein, processor 45 identifies defective wire configurations using the measured gain G of cable test circuit 35. When cable 20 has one or more defective wires, the measured gain value of circuit 35 is different from the expected gain value of a non-defective cable. Defect wire configurations can comprise one or more wires among the N wires with an open circuit, a short circuit between the different N multiple wires in the cable, or any other defect resulting in a measured gain value different from the expected gain value for a non-defective cable given by Equations (1) and (2).

Each pairing combination of resistors in first bank 100 (e.g., R, 3R, ...), wires in cable 20 (e.g., WIRE(1), WIRE(2), ...) and resistors in second bank 105 (e.g., 2R, 4R, ...) contribute differently to $R_{EQ}$ in Eqn. (2). Hence, the gain in Eqn. (1) is affected differently for a defect in WIRE(1) as compared to WIRE(N) in the N wires in the cable.

The resistor values in the resistor bank are typically chosen so that each expected defect in cable 20 (e.g., open wire or short circuit) will translate to a different gain of the test circuit. With this choice of resistors, the measured gain gives an unambiguous identification of the actual defect.

In some embodiments, lookup tables storing the gain computed for various defective wire configurations are calculated and stored in LUT 50. The measured gain can then be compared to the different defective wire configurations so as to specifically identify the wire indices of the one or more defective wires in the cable.

The embodiments shown in FIGS. 1 and 2 are chosen for conceptual clarity and not by way of limitation of the embodiments of the present invention. In alternative embodiments, any other suitable test set and test circuit configuration can be used. Amplifier 110 may comprise any suitable amplifier configuration. Any suitable measurable parameter of the amplifier can be used to identify the one or more defective wires. The measured gain of the test circuit in test cable set 10 is not limited to the gain measurement of cable test circuit 35.

To further illustrate the method described herein of identifying defective wire configurations from the gain measurements, exemplary computations of the gain and output voltages in volts for different defective wire configurations are shown in Tables I-IX. Tables I-III show gain values for open and short circuited wire configurations for a cable with four wires (N=4), Tables IV-VI show gain values for open and short circuited wire configurations for a cable with twenty wires (N=20), and Tables VII-IX show gain values for open and short circuited wire configurations for a cable with eighty wires (N=80). For the wire defect configurations shown in Tables I-IX, the computed gain for a non-defective (normal) cable is 100 for an input voltage $V_{IN}$=50 mV and $R_F$=100*$R_{EQ}$.

Tables I-IX show specific wire defect configurations where one wire is either open circuited (as denoted by "OPEN CIRCUITED WIRE" in Tables I, IV, and VII), or short circuited to another wire among the N multiple wires in the cable (as denoted by "SHORT CIRCUIT PAIRS" in Tables II, III, V, VI, VIII and IX). In Table II, for example, a gain of 100.6010929 is computed when WIRE (1) is shorted to WIRE (2), and this short circuit pair is denoted WIRE(1)/WIRE(2).

Parametrically, the value of the gain and output voltage decrease for open circuit wires as shown in Tables I, IV, and VII. Similarly, the value of the gain and output voltage increase for short circuit wires as shown in Tables II, III, V, VI, VIII and IX. When comparing the measured gain of cable test circuit to the calculated gain shown in Tables I-IX, an open circuit wire can be identified by a measured gain smaller than the computed gain. Similarly, a short circuited wire can be identified by a measured gain larger than the computed gain.

In the case of wires with open circuit defects in the cable, the value of the N resistors progressively increase in first resistor bank 100 (e.g., R, 3R, 5R, . . . , [2N−3]R, and [2N−1]R) and in second resistor bank 105 (e.g., 2R, 4R, 6R, . . . , [2N−2]R, and 2NR) as can be seen in FIG. 2. As a result, open circuited wires with a low wire index (e.g., WIRE(1) in Table I) have a much larger impact on $R_{EQ}$ and gain G since the resistor values in those branches in the resistor bank are lower in contrast to branches with open circuited wires have high wire indices (e.g., WIRE(4) in Table I). These same parametric trends are seen in Tables I, IV and VII.

In the case of short circuit wire defects, the gain increases as the $R_{EQ}$ decreases as shown in Tables II, III, V, VI, VIII and IX. The impact on the gain is higher for the wire pairs when one of the wires have a low wire index due to the lower resistance values in the resistor banks (e.g., short circuit pairs WIRE(1)/WIRE(2), WIRE(1)/WIRE(3), WIRE(1)/WIRE(4) in Table II), but there is less impact on the gain for the higher index short circuited wire pairs (e.g., WIRE(3)/WIRE(4) in Table II).

The data shown in Tables I-IX are calculations for only one open circuit wire, or for one short circuit pair, which is shown here only for conceptual clarity and not by way of limitation of the embodiments of the present invention. The computed gain for any number of defective wires can be calculated for any defect wire configurations and uploaded to LUT 50. The measured gain can then be compared to data in LUT 50 by processor 45 so as to identify the defective wire configuration, and subsequently the wire indices of the one or more defective wires in the cable.

TABLE I

Gain and Output Voltage (V) for N = 4: Open Circuit

| OPEN CIRCUITED WIRE | Gain | Output (V) |
| --- | --- | --- |
| WIRE (1) | 47.40437158 | 2.3702186 |
| WIRE (2) | 77.45901639 | 3.8729508 |
| WIRE (3) | 85.6557377 | 4.2827869 |
| WIRE (4) | 89.48087432 | 4.4740437 |

TABLE II

Gain for N = 4: Short Circuit Pairs

| SHORT CIRCUIT PAIRS: GAIN | WIRE (2) | WIRE (3) | WIRE (4) |
| --- | --- | --- | --- |
| WIRE (1) | 100.6010929 | 100.6830601 | 100.6375228 |
| WIRE (2) | XXX | 100.023967 | 100.0420345 |
| WIRE (3) | XXX | XXX | 100.0035883 |

TABLE III

Output Voltage (V) for N = 4: Short Circuit Pairs

| SHORT CIRCUIT PAIRS: OUTPUT (V) | WIRE (2) | WIRE (3) | WIRE (4) |
| --- | --- | --- | --- |
| WIRE (1) | 5.030054645 | 5.034153005 | 5.031876138 |
| WIRE (2) | XXX | 5.001198351 | 5.002101723 |
| WIRE (3) | XXX | XXX | 5.000179415 |

TABLE IV

Gain and Output Voltage (V) for N = 20: Open Circuit

| OPEN CIRCUITED WIRE | Gain | Output (V) |
| --- | --- | --- |
| WIRE (1) | 67.43294696 | 3.3716473 |
| WIRE (2) | 86.04269155 | 4.3021346 |
| WIRE (19) | 98.69731788 | 4.9348659 |
| WIRE (20) | 98.76327647 | 4.9381638 |

TABLE V

Gain for N = 20: Short Circuit Pairs

| SHORT CIRCUIT PAIRS: GAIN | WIRE (2) | WIRE (18) | WIRE (19) | WIRE (20) |
| --- | --- | --- | --- | --- |
| WIRE (1) | 100.3721949 | 100.135198 | 100.1288367 | 100.1230418 |
| WIRE (2) | XXX | 100.0208126 | 100.0200269 | 100.0192931 |
| WIRE (18) | XXX | XXX | 100.0000004 | 100.0000013 |
| WIRE (19) | XXX | XXX | XXX | 100.0000003 |

TABLE VI

Output Voltage (V) for N = 20: Short Circuit Pairs

| SHORT CIRCUIT PAIRS: OUTPUT (V) | WIRE (2) | WIRE (18) | WIRE (19) | WIRE (20) |
| --- | --- | --- | --- | --- |
| WIRE (1) | 5.018609745 | 5.006759901 | 5.006441835 | 5.00615209 |
| WIRE (2) | XXX | 5.001040632 | 5.001001344 | 5.000964655 |
| WIRE (18) | XXX | XXX | 5.000000019 | 5.000000066 |
| WIRE (19) | XXX | XXX | XXX | 5.000000014 |

TABLE VII

Gain and Output Voltage (V) for N = 80: Open Circuit

| OPEN CIRCUITED WIRE | Gain | Output (V) |
|---|---|---|
| WIRE (1) | 75.62913737 | 3.7814569 |
| WIRE (2) | 89.55534459 | 4.4777672 |
| WIRE (79) | 99.76789655 | 4.9883948 |
| WIRE (80) | 99.77080693 | 4.9885403 |

TABLE VIII

Gain for N = 80: Short Circuit Pairs

| SHORT CIR- CUIT PAIRS: GAIN | WIRE (2) | WIRE (78) | WIRE (79) | WIRE (80) |
|---|---|---|---|---|
| WIRE (1) | 100.2785241 | 100.00254019 | 100.0250883 | 100.0247822 |
| WIRE (2) | XXX | 100.00044853 | 100.0044322 | 100.0043803 |
| WIRE (78) | XXX | XXX | 100+195e−12 | 100+755e−12 |
| WIRE (79) | XXX | XXX | XXX | 100+183e−12 |

TABLE IX

Output Voltage (V) for N = 80: Short Circuit Pairs

| SHORT CIRCUIT PAIRS: OUTPUT (V) | WIRE (2) | WIRE (78) | WIRE (79) | WIRE (80) |
|---|---|---|---|---|
| WIRE (1) | 5.013926207 | 5.001270096 | 5.001254413 | 5.00615209 |
| WIRE (2) | XXX | 5.000224267 | 5.000221609 | 5.000964655 |
| WIRE (78) | XXX | XXX | 5+9.74e−12 | 5+37.73e−12 |
| WIRE (79) | XXX | XXX | XXX | 5+9.14e−12 |

The relative step size in the changes in the gain and the output voltage as a function of open circuit wire, or short circuit pair decreases significantly with an increasing number of wires N in the cable. The gain, or output voltage, from circuit 35 is detected with A/D 40 and converted to a digital word for use in processor 45. A finer resolution of A/D 40 is needed to resolve the smaller step size in the gain and output voltage as the number of wires N in the cable increases.

A summary of the A/D resolution versus the number of wires N and the type of wire defect (open or short) is shown in Table X. Since the gain varies weakly for short circuit wire pair defects as shown in Tables II, V, and VIII, finer A/D resolution is needed to identify short circuit wire defects relative to the open circuit wire defects in the cable. For example, an A/D resolution of 100 µV is needed in CTS 10 to detect one open circuited wire in cable 20 for N=80, but a resolution of 0.1 pV is needed for one short circuit wire in cable 20 for N=80.

TABLE X

A/D resolution for different N and Wire Defect

| Number of wires in cable (N) | Wire Defect | A/D resolution |
|---|---|---|
| 4 | Open | 100 mV |
| 4 | Short | 100 µV |
| 20 | Open | 1 mV |
| 20 | Short | 1 nV |
| 80 | Open | 100 µV |
| 80 | Short | 0.1 pV |

Figure 3:
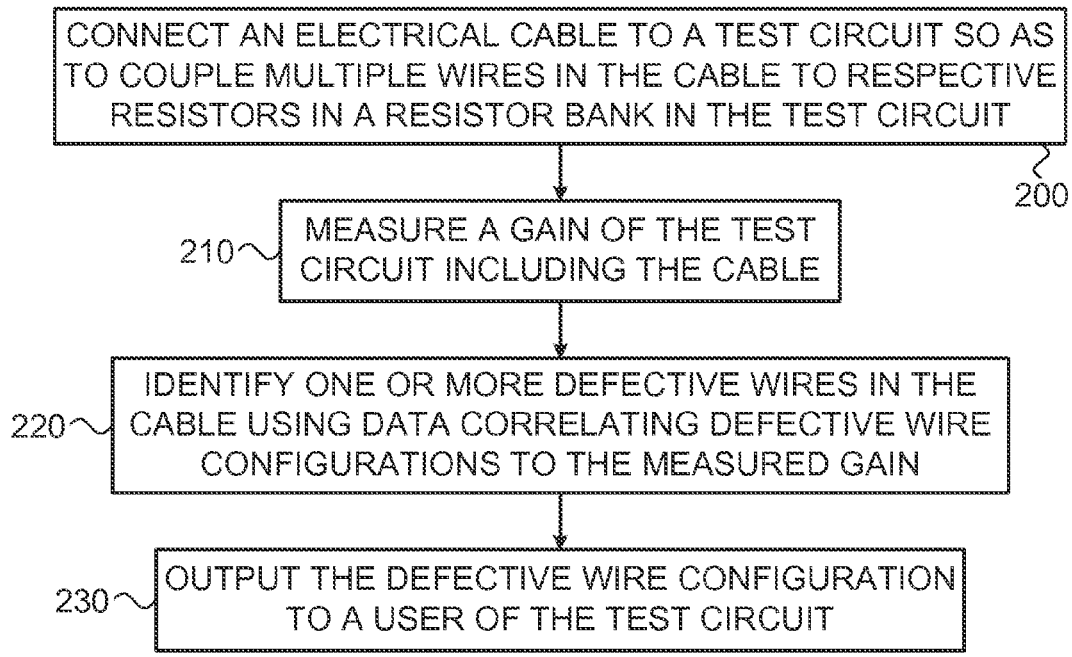
FIG. 3 is a flow chart that schematically illustrates a method for identifying defective wires in an electrical cable, in accordance with an embodiment of the present invention.

FIG. 3 is a flow chart that schematically illustrates a method for identifying defective wires in an electrical cable, in accordance with an embodiment of the present invention. In a connecting step 200, an electrical cable is connected to a test circuit so as to couple multiple wires in the cable to respective resistors in a resistor bank in the test circuit. In a measuring step 210, processor 45 measures the gain of the test circuit including the cable. In an identifying step 220, the processor identifies one or more defective wires in the cable using data correlating defective wire configurations (in LUT 50) to the measured gain. The wire indices of the one or more defective wires and the defect type (e.g., an open or short circuit wire) are identified. In an outputting step 230, processor 45 outputs the defective wire configuration to a user of the test circuit.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
    coupling an electrical cable, comprising multiple wires, to circuitry having a configuration comprising a resistor bank connected to the wires and a gain amplifier including a feedback resistor, the resistor bank including a first plurality of resistors and a second plurality of resistors, the second plurality of resistors being coupled to the gain amplifier, each of the first plurality of resistors having a progressively increasing resistance, each of the second plurality of resistors having a progressively increasing resistance different than the progressively increasing resistance of the first plurality of resistors, wherein each wire is coupled between a resistor in the first plurality of resistors and a corresponding resistor in the second plurality of resistors;
    measuring a gain of the circuitry and the cable;
    identifying that one or more of the wires in the cable is defective based on the measured gain being different than an expected gain, the expected gain being determined from the circuitry configuration and a non-defective cable; and outputting an indication that one or more of the wires is defective.

2. The method according to claim 1, wherein the first plurality of resistors have resistances that are odd multiples of a resistance R, and wherein the second plurality of resistors have the resistances that are even multiples of R.

3. The method according to claim 1, wherein identifying that the one or more wires is defective comprises identifying an open circuit in one or more of the wires upon detecting that the measured gain is smaller than the expected gain for a non-defective cable.

4. The method according to claim 1, wherein that identifying the one or more wires is defective comprises identifying a short circuit between two or more of the wires upon detecting that the measured gain is larger than the expected gain for a non-defective cable.

5. The method according to claim 1, further comprising comparing the measured gain to a predefined list of gains for predefined defective wire configurations stored in a lookup table to identify which one of the one or more wires in the defective cable is defective.

6. The method according to claim 1, wherein the identification of the defective wire in the defective cable comprises finding on the predefined list of gains the defective wire configuration that matches the measured gain.

7. An apparatus, comprising:
an interface for coupling to an electrical cable comprising multiple wires; and
circuitry having a configuration comprising a resistor bank connected to the wires and a gain amplifier including a feedback resistor, the resistor bank including a first plurality of resistors and a second plurality of resistors, the second plurality of resistors being coupled to the gain amplifier, each of the first plurality of resistors having a progressively increasing resistance, each of the second plurality of resistors having a progressively increasing resistance different than the progressively increasing resistance of the first plurality of resistors, wherein each wire is coupled between a resistor in the first plurality of resistors and a corresponding resistor in the second plurality of resistors.

8. The apparatus according to claim 7, wherein the first plurality of resistors have resistances that are odd multiples of a resistance R, and wherein the second plurality of resistors have the resistances that are even multiples of R.

9. The apparatus according to claim 7, wherein the circuitry is configured to identify an open circuit in one or more of the wires upon detecting that the measured gain is smaller than an expected gain for a non-defective cable.

10. The apparatus according to claim 7, wherein the circuitry is configured to identify a short circuit between two or more of the wires upon detecting that the measured gain is larger than an expected gain for a non-S defective cable.

11. The apparatus according to claim 7, wherein the circuitry is configured to store a predefined list of gains for respective expected defects in the cable, and to identify the one or more defective wires by finding on the list an expected defect that matches the measured gain.

* * * * *